US009308697B2

(12) United States Patent
Ke et al.

(10) Patent No.: US 9,308,697 B2
(45) Date of Patent: Apr. 12, 2016

(54) METHOD FOR FABRICATING FLEXIBLE DISPLAY MODULE

(71) Applicant: Au Optronics Corporation, Hsinchu (TW)

(72) Inventors: Tsung-Ying Ke, Tainan (TW); Pei-Yun Wang, New Taipei (TW); Pin-Fan Wang, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 340 days.

(21) Appl. No.: 13/893,363

(22) Filed: May 14, 2013

(65) Prior Publication Data
US 2014/0042649 A1 Feb. 13, 2014

(30) Foreign Application Priority Data

Aug. 9, 2012 (TW) .............................. 101128841 A

(51) Int. Cl.
B29D 11/00 (2006.01)
B32B 43/00 (2006.01)
H01L 29/786 (2006.01)
H01L 27/12 (2006.01)

(52) U.S. Cl.
CPC .......... *B29D 11/0073* (2013.01); *B32B 43/006* (2013.01); *H01L 27/1218* (2013.01); *H01L 29/78603* (2013.01); *Y10T 156/1158* (2015.01)

(58) Field of Classification Search
CPC ............ B29D 11/0073; H01L 27/1218; H01L 29/78603; H01L 2227/326; H01L 27/3244; H01L 51/003; H01L 51/56; H01L 21/324; H01L 2221/68368; H01L 27/1214; H01L 27/1266; H01L 2924/00; H01L 2224/32225; B32B 43/006; Y10T 156/1158

USPC ......................................................... 156/247
See application file for complete search history.

(56) References Cited

U.S. PATENT DOCUMENTS 7,245,331 B2    7/2007  Yamazaki et al.
7,566,950 B2 *  7/2009  Huang et al. ................... 257/637
7,672,038 B2    3/2010  Shinn et al.
(Continued)

FOREIGN PATENT DOCUMENTS

CN    102509719    6/2012
TW    I287298      9/2007
(Continued)

*Primary Examiner* — Philip Tucker
*Assistant Examiner* — Jimmy Smith, Jr.
(74) *Attorney, Agent, or Firm* — Jianq Chyun IP Office

(57) ABSTRACT

A method for fabricating flexible display module mainly includes following steps: providing a transparent carrier with a carrying-surface and a back-surface opposite to the carrying-surface; forming a photosensitive-release-film on the carrying-surface; providing a flexible substrate on the photosensitive-release-film; forming a pixel array on the flexible substrate; during or after forming the pixel array, conducting irradiation on the photosensitive-release-film from the back-surface of the transparent carrier to weaken bonding force between the photosensitive-release-film and the transparent carrier or simultaneously weaken both the bonding force between the photosensitive-release-film and the transparent carrier and the structure strength of the photosensitive-release-film; and then, removing the flexible substrate from the transparent carrier, in which at least one portion of the photosensitive-release-film is peeled off from the carrying-surface and remains on the flexible substrate.

14 Claims, 6 Drawing Sheets

(56) References Cited

U.S. PATENT DOCUMENTS

| | | | |
|---|---|---|---|
| 7,714,950 | B2 | 5/2010 | Yamazaki et al. |
| 7,892,867 | B2 | 2/2011 | Shinn et al. |
| 8,168,511 | B2 * | 5/2012 | Nishiki et al. ............... 438/458 |
| 8,228,454 | B2 | 7/2012 | Yamazaki et al. |
| 8,508,682 | B2 | 8/2013 | Yamazaki et al. |
| 8,830,413 | B2 | 9/2014 | Yamazaki et al. |
| 8,940,208 | B2 | 1/2015 | Liu et al. |
| 2004/0239827 | A1 | 12/2004 | Yamazaki et al. |
| 2007/0211189 | A1 | 9/2007 | Yamazaki et al. |
| 2007/0295973 | A1 * | 12/2007 | Jinbo et al. ..................... 257/88 |
| 2010/0068483 | A1 | 3/2010 | Leu et al. |
| 2010/0167031 | A1 * | 7/2010 | Leu et al. ..................... 428/212 |
| 2010/0167437 | A1 | 7/2010 | Yamazaki et al. |
| 2010/0203296 | A1 * | 8/2010 | Tsai .................... H01L 21/6835 428/172 |
| 2010/0224320 | A1 * | 9/2010 | Tsai ....................... G02F 1/1303 156/707 |
| 2012/0119235 | A1 * | 5/2012 | Nishiyama et al. ............. 257/88 |
| 2012/0164408 | A1 * | 6/2012 | Hwu et al. ..................... 428/202 |
| 2012/0295375 | A1 | 11/2012 | Yamazaki et al. |
| 2013/0071650 | A1 | 3/2013 | Liu et al. |
| 2013/0306948 | A1 | 11/2013 | Yamazaki et al. |
| 2014/0339564 | A1 | 11/2014 | Yamazaki et al. |

FOREIGN PATENT DOCUMENTS

| | | |
|---|---|---|
| TW | 201011427 | 3/2010 |
| TW | I354854 | 12/2011 |
| TW | 201211660 | 3/2012 |

* cited by examiner

METHOD FOR FABRICATING FLEXIBLE DISPLAY MODULE

CROSS-REFERENCE TO RELATED APPLICATION

This application claims the priority benefit of Taiwan application serial no. 101128841, filed on Aug. 9, 2012. The entirety of the above-mentioned patent application is hereby incorporated by reference herein and made a part of this specification.

BACKGROUND OF THE INVENTION

1. Field of the Invention

The invention generally relates to a method for fabricating a display device, and more particularly, to a method for fabricating a flexible display module.

2. Description of Related Art

Along with the rapid advances of display technology, the display has been gradually developed into the flat panel display (FPD) from the early-age cathode ray tube (CRT). In comparison with the FPD based on a hard carrier board (such as glass substrate), the flexible substrate (such as a plastic substrate) is flexible and impact-resistant. Therefore in recent years, research has been underway on the fabrication of active devices on a flexible substrate.

In general, a flexible substrate of the flexible display panel is fixed on a glass substrate first, followed by fabricating the displaying component on the flexible substrate. Upon finishing the displaying component, the flexible substrate is removed from the glass substrate.

However, it is known that a release-interface between the flexible substrate and the glass substrate is easily affected by the successive process condition (e.g., temperature), which makes the releasing mechanism disable or unstable and reduces the production yield. In addition, another scheme by selecting a sacrifice layer employed as the release-interface, due to the limited successive process condition, has very limited material to be selected for the sacrifice layer, so that it fails to be properly adjusted in response to the process demand. Moreover, some release schemes by adopting mechanical way or high-power laser have poor production yield or high cost problem as well.

SUMMARY OF THE INVENTION

Accordingly, the invention is directed to a method for fabricating flexible display module, which mainly includes following steps: providing a transparent carrier with a carrying-surface and a back-surface opposite to the carrying-surface; forming a photosensitive-release-film on the carrying-surface; providing a flexible substrate on the photosensitive-release-film; forming a pixel array on the flexible substrate; during or after forming the pixel array, conducting irradiation on the photosensitive-release-film from the back-surface of the transparent carrier to weaken bonding force between the photosensitive-release-film and the transparent carrier or simultaneously weaken both the bonding force between the photosensitive-release-film and the transparent carrier and the structure strength of the photosensitive-release-film; and then, removing the flexible substrate from the transparent carrier, in which at least one portion of the photosensitive-release-film is peeled off from the carrying-surface and remains on the flexible substrate.

In an embodiment of the present invention, the above-mentioned step of forming the pixel array includes: forming a plurality of active devices on the flexible substrate; and forming a displaying component on the active devices.

In an embodiment of the present invention, the above-mentioned step of conducting irradiation on the photosensitive-release-film is performed after forming the active devices but prior to forming the displaying component.

In an embodiment of the present invention, the above-mentioned method for fabricating flexible display module further includes conducting heat treatment on the photosensitive-release-film prior to forming the pixel array so as to increase the bonding force between the photosensitive-release-film and the transparent carrier.

In an embodiment of the present invention, the above-mentioned heat treatment includes annealing.

In an embodiment of the present invention, the above-mentioned photosensitive-release-film includes a UV-sensitive material.

In an embodiment of the present invention, the material of the photosensitive-release-film includes parylene or photoresistive material.

In an embodiment of the present invention, the above-mentioned light used to irradiate the photosensitive-release-film is ultraviolet (UV) light.

In an embodiment of the present invention, the power of the light used to irradiate the photosensitive-release-film is greater than or equal to 5 mW/cm$^2$ but less than or equal to 300 mW/cm$^2$.

In an embodiment of the present invention, the material of the flexible substrate includes polyimide (PI), polyethylene terephthalate (PET) and polyethylene naphthalate (PEN).

In an embodiment of the present invention, after conducting irradiation on the photosensitive-release-film from the back-surface of the transparent carrier, the releasing force between the photosensitive-release-film and the transparent carrier is less than or equal to 25 gf. In an embodiment of the present invention, the above-mentioned photosensitive-release-film entirely overlaps the bottom-surface of the flexible substrate.

In an embodiment of the present invention, the above-mentioned method for fabricating flexible display module further includes forming an assist-BUV layer between the photosensitive-release-film and the transparent carrier.

In an embodiment of the present invention, the above-mentioned method for fabricating flexible display module further includes forming an assist-BUV layer between the photosensitive-release-film and the flexible substrate.

In an embodiment of the present invention, the above-mentioned method for fabricating flexible display module further includes forming a barrier layer between the assist-BUV layer and the flexible substrate.

In an embodiment of the present invention, the above-mentioned method for fabricating flexible display module further includes forming an assist-BUV layer between the pixel array and the flexible substrate.

Based on the description above, the method for fabricating flexible display module of the invention can form a good and stable release interface between the flexible substrate and the transparent carrier through the photosensitive-release-film. The photosensitive-release-film has good temperature-durability so as to advance the process flexibility and the range of the selectable materials. On the other hand, by conducting irradiation on the photosensitive-release-film, in the invention, the bonding force between the photosensitive-release-film and the transparent carrier is reduced, in which the irradiation light can be a low-power light source (for example, UV light) so that the cost is reduced.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

FIGS. 1A-1F are schematic diagrams illustrating the fabrication flowchart of a flexible display module according to an embodiment of the invention.

Figure 1A:
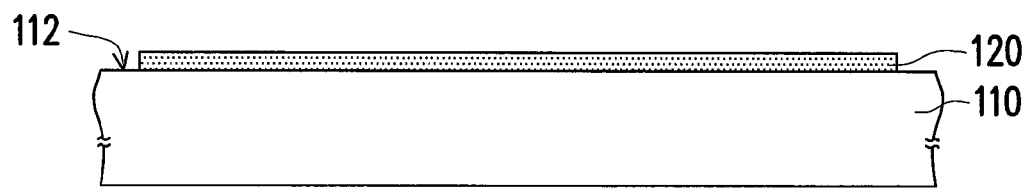
FIGS. 1A-1F are schematic diagrams illustrating the fabrication flowchart of a flexible display module according to an embodiment of the invention.

As shown by FIG. 1A, first, a photosensitive-release-film 120 is formed on a carrying-surface 112 of a transparent carrier 110, in which the transparent carrier 110 is, for example, a plate such as a glass substrate with transparency and able to provide sufficient supporting strength. The photosensitive-release-film 120 is, for example, an organic polymer which is UV-sensitive or sensitive to the light of specific wave-band and comprises parylene or photoresistive material. The parylene can be N-type, C-type, D-type or HT-type ones and the above-mentioned photoresistive material can be positive-type or negative-type ones. In more details, the positive-type photoresistive material is, for example, phenol formaldehyde resin, polymethylmethacrylate (PMMA, i.e. acrylic), while the negative-type photoresistive material is, for example, epoxy-base resin or acrylic resin. The transparent carrier 110 and the photosensitive-release-film 120 have good temperature-durability, and the bonding force between the transparent carrier 110 and the photosensitive-release-film 120 can be enhanced through a successive high-temperature process (for example, greater than 250° C.).

Figure 1B:
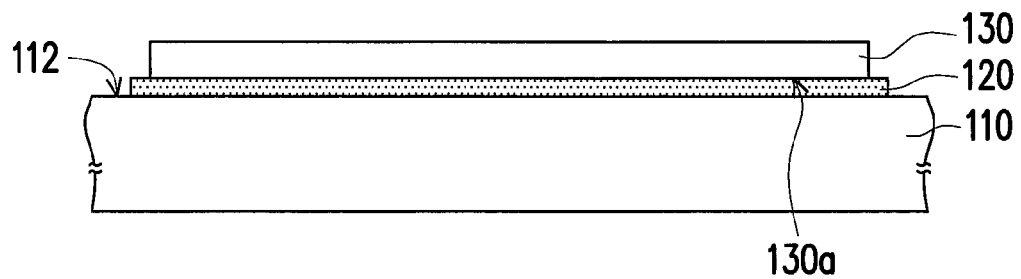

Next, referring to FIG. 1B, a flexible substrate 130 is provided, which then is fixed on the transparent carrier 110 by using the photosensitive-release-film 120. The successive high-temperature process would enhance the bonding force between the transparent carrier 110 and the photosensitive-release-film 120 so that the flexible substrate 130 can be firmly attached onto the transparent carrier 110. The material of the flexible substrate 130 includes organic polymer such as polyimide (PI), polyethylene terephthalate (PET) and polyethylene naphthalate (PEN). In addition, the photosensitive-release-film 120 in the embodiment can, for example, entirely overlap the bottom-surface 130a of the flexible substrate 130, which means no patterning process on the photosensitive-release-film 120; instead, the entire photosensitive-release-film 120 is formed on the bonding-surface of the flexible substrate 130.

Figure 1C:
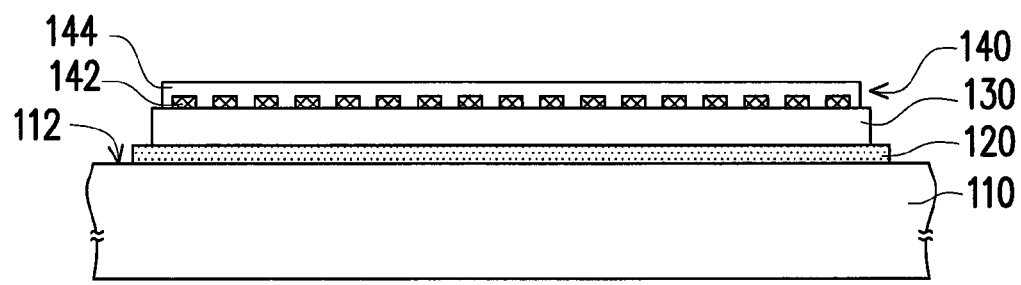

Then, referring to FIG. 1C, a pixel array 140 is formed on the flexible substrate 130. The pixel array 140 includes a plurality of active devices 142 formed on the flexible substrate 130 and a displaying component 144 located on the active devices 142. Depending on the type of the flexible display module, the pixel array 140 includes different components, for example, the active devices 142 can be thin film transistors (TFTs) and the displaying component 144 can be electro-phoretic display (EPD) component or organic light-emitting diode (OLED) displaying component. In the given display architecture, the pixel array 140 may further include scan lines, data lines and displaying electrodes. The pixel array 140 is fabricated through, for example, spreading, deposition, etching and high-temperature processing.

Figure 1D:
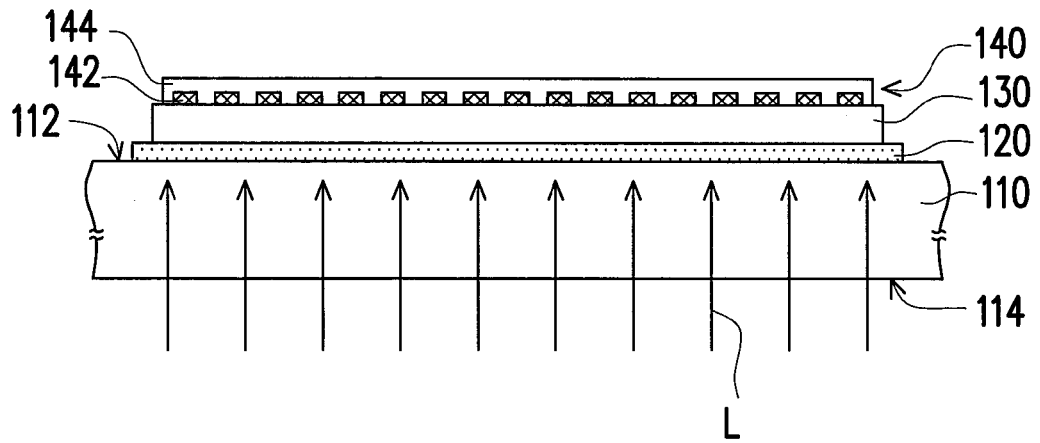

Thereafter, referring to FIG. 1D, after finishing the process of the above-mentioned pixel array 140, it is conducted an irradiation process with light L on the photosensitive-release-film 120 from the back-surface 114 of the transparent carrier 110 so as to weaken the bonding force between the photosensitive-release-film 120 and the transparent carrier 110. Since the transparent carrier 110 is a complete transparent body, the photosensitive-release-film 120 can be entirely and evenly affected by light so as to make the photosensitive-release-film 120 evenly produce degradation under the light. In this way, the bonding force at every point on the bonding-surface between photosensitive-release-film 120 and the transparent carrier 110 gets weakened in the same extent. The light L of irradiation on the photosensitive-release-film 120 is, for example, ultraviolet (UV) light with power of 5-300 mW/cm$^2$ for example. Along with different photosensitive characteristics of the selected photosensitive-release-film 120, the light of irradiation on the photosensitive-release-film 120 can certainly have different wave-bands and different powers.

Figure 1E:
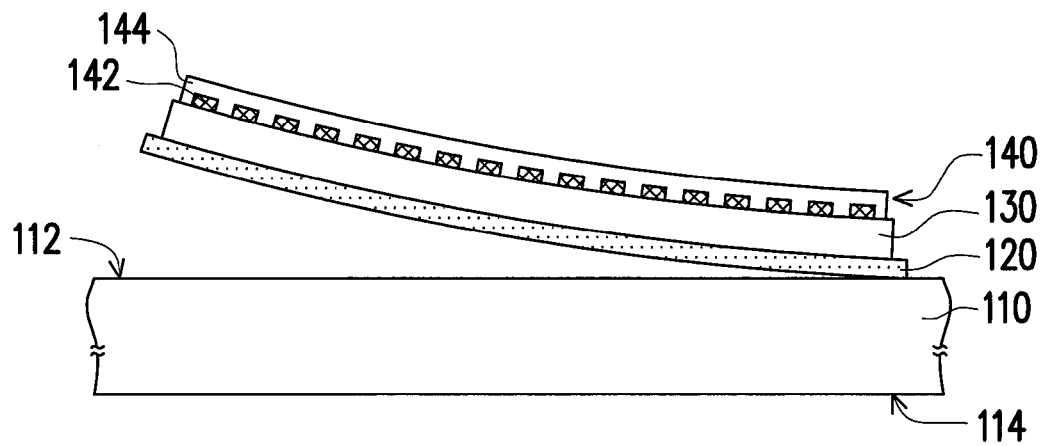

Further as shown by FIG. 1E, the flexible substrate 130 is removed from the transparent carrier 110. Since the bonding force between the photosensitive-release-film 120 and the transparent carrier 110 at the time is weakened through the above-mentioned irradiation step, the photosensitive-release-film 120 would be peeled off from the carrying-surface 112 of the transparent carrier 110 but still remain on the flexible substrate 130. The photosensitive-release-film 120 remaining on the flexible substrate 130 can increase the water-proof and oxygen-proof capability of the removed flexible display module. In the embodiment, the required releasing force to peel off the photosensitive-release-film 120 from the carrying-surface 112 of the transparent carrier 110 is, for example, less than or equal to 25 gf. In fact, the required releasing force is varied with the materials of the photosensitive-release-film 120 and the transparent carrier 110, the irradiation doses on the photosensitive-release-film 120 or other treatments.

Figure 1F:
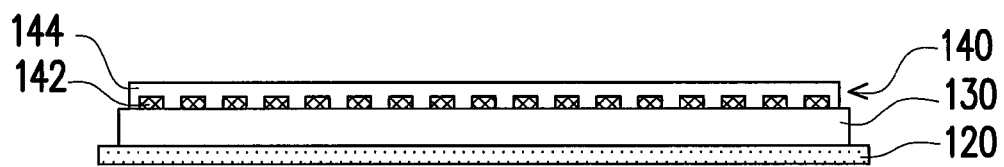

At the time, the flexible display module 100 shown by FIG. 1F is obtained.

Figure 2A:
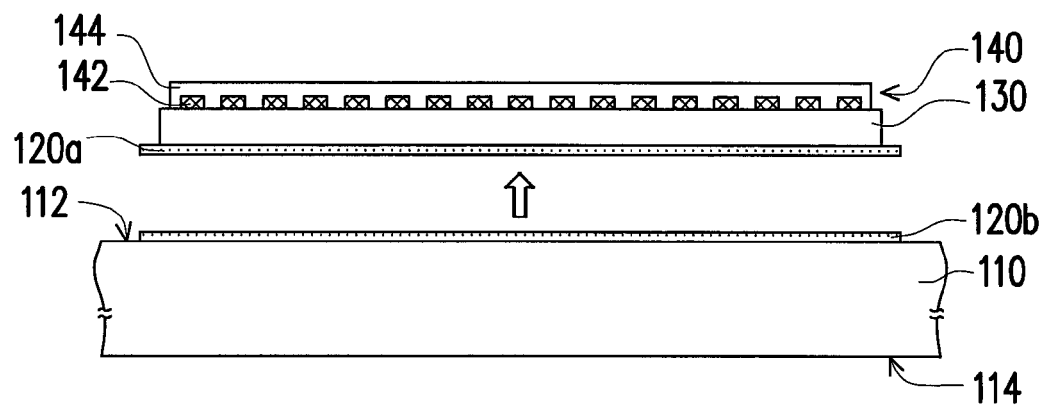
FIGS. 2A, 2B, 3 and 4 are diagrams respectively showing modified or selected process steps in the fabrication flowchart of the above-mentioned flexible display module.
Figure 2B:
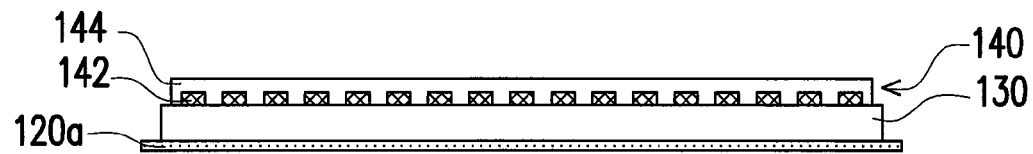

On the other hand, after the irradiation step of FIG. 1D, not only the bonding force between the photosensitive-release-film 120 and the transparent carrier 110 is weakened, but also the structure strength of the photosensitive-release-film 120 itself may be weakened by the irradiation depending on the selected material of the photosensitive-release-film 120. Therefore, during removing the flexible substrate 130 from the transparent carrier 110, if the weakening speed of the structure strength of the photosensitive-release-film 120 is greater than the weakening speed of the bonding force between the photosensitive-release-film 120 and the transparent carrier 110, the photosensitive-release-film 120 itself may be broken. Thus, only a portion of the photosensitive-release-film 120a is peeled off from the carrying-surface 112 and remains the other portion on the flexible substrate 130 as shown by FIG. 2A. The rest photosensitive-release-film 120b remains on the carrying-surface 112 of the transparent carrier 110 to obtain a flexible display module 102 as shown by FIG. 2B.

Figure 3:
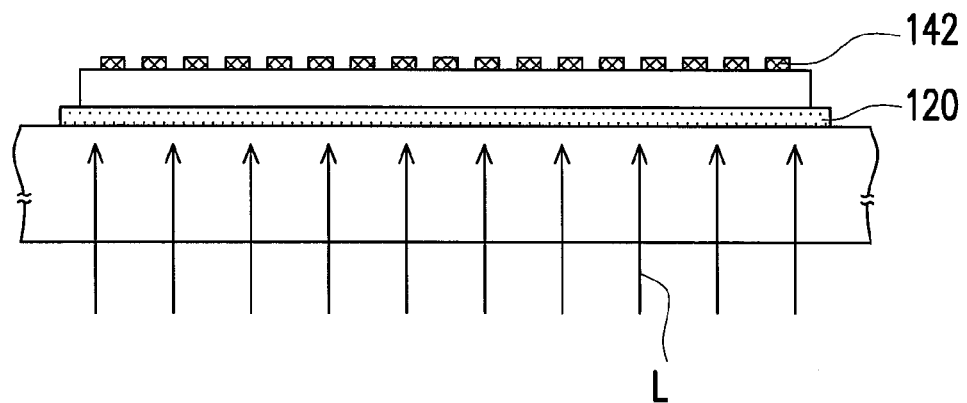

It should be noted that the irradiation step on the photosensitive-release-film is not restricted after finishing the pixel array. The irradiation step on the photosensitive-release-film 120 can be conducted during fabricating the pixel array 140 so as to better coordinate the irradiation step and other fabrication steps of the pixel array 140. Taking the process of the above-mentioned embodiment as an example, referring to FIG. 3 where the irradiation step on the photosensitive-release-film 120 with the light L is arranged after forming the active devices 142, followed by the displaying component 144 on the active devices 142 as shown by FIG. 1C.

Figure 4:
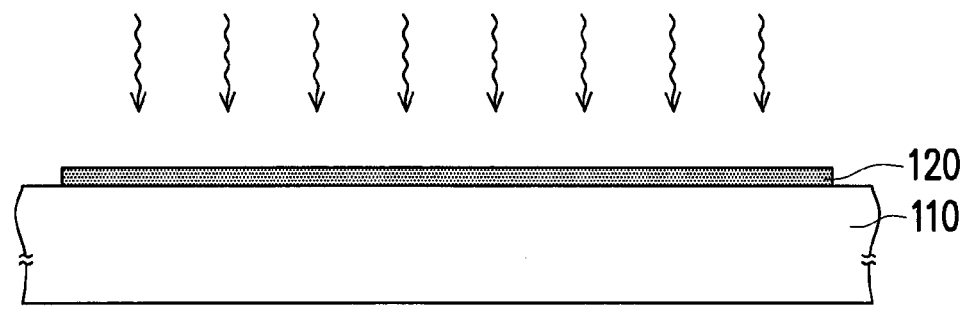

In order to ensure the firm bonding between the photosensitive-release-film 120 and the transparent carrier 110, as shown by FIG. 4, a heat treatment on the photosensitive-release-film 120 is conducted before the above-mentioned step of FIG. 1B so as to increase the bonding force between the photosensitive-release-film 120 and the transparent carrier 110, in which the above-mentioned heat treatment is, for example, annealing or other appropriate process.

Figure 5:
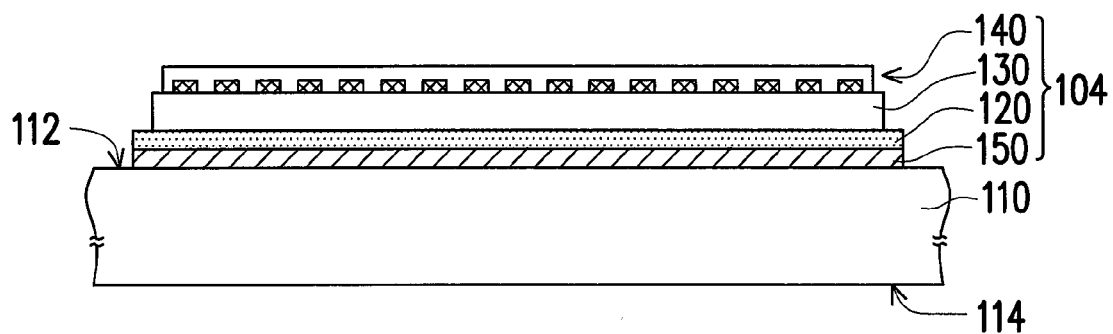
FIGS. 5-8 are schematic diagrams of flexible display modules according to other embodiments of the invention.

FIG. 5 is a schematic diagram of a flexible display module according to another embodiment of the invention. In the embodiment, an assist-BUV layer 150 is further employed and disposed between the photosensitive-release-film 120 and the carrying-surface 112 of the transparent carrier 110 for enhancing the effect of irradiation on the photosensitive-release-film 120 from the back-surface 114 of the transparent carrier 110, in which the photosensitive-release-film 120 can evenly receive the irradiate light. When the flexible substrate 130 is removed from the transparent carrier 110, the assist-BUV layer 150 would be removed from the photosensitive-release-film 120 and remain on transparent carrier 110. The assist-BUV layer 150 herein is, for example, formed on the carrying-surface 112 of the transparent carrier 110 prior to forming the photosensitive-release-film 120. The material of the assist-BUV layer 150 includes, for example, porous inorganic materials, such as, aluminium, platinum, silver, titanium, molybdenum, zinc, tin, silicon oxide, titanium oxide, aluminium oxide, molybdenum oxide, indium oxide, zinc oxide, tin oxide, indium tin oxide, indium zinc oxide, positive/negative type photoresistive material.

Figure 6:
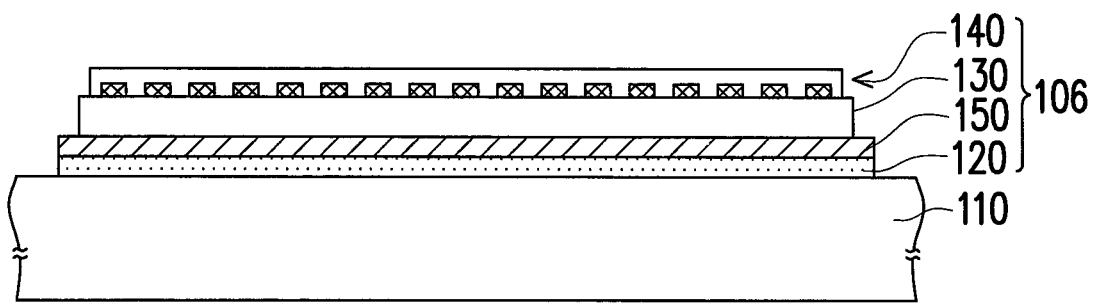

FIG. 6 is a schematic diagram of a flexible display module according to yet another embodiment of the invention. In comparison with the embodiment of FIG. 5, in the embodiment, the assist-BUV layer 150 is disposed between the photosensitive-release-film 120 and the flexible substrate 130. The assist-BUV layer 150 herein is, for example, formed on the photosensitive-release-film 120 after forming the photosensitive-release-film 120 as shown by FIG. 1A. Then, the flexible substrate 130 is disposed on the assist-BUV layer 150, in which the assist-BUV layer 150 has the same waterproof and oxygen-proof feature. When the flexible substrate 130 is removed from the transparent carrier 110, the assist-BUV layer 150 together with the photosensitive-release-film 120 would remove from the transparent carrier 110, in which the assist-BUV layer 150 can enhance the water-proof and oxygen-proof capability of the flexible display module 106 as well.

Figure 7A:
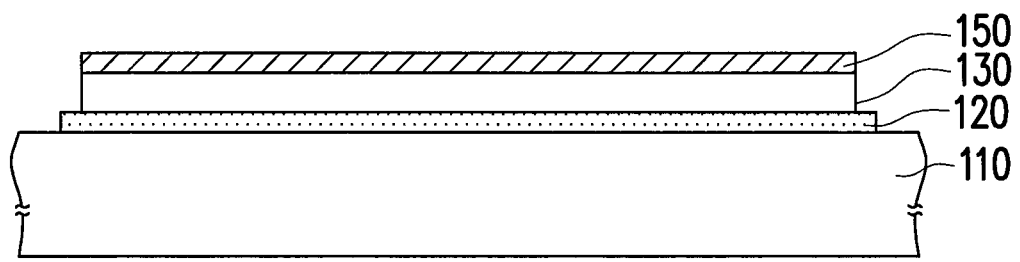
Figure 7B:
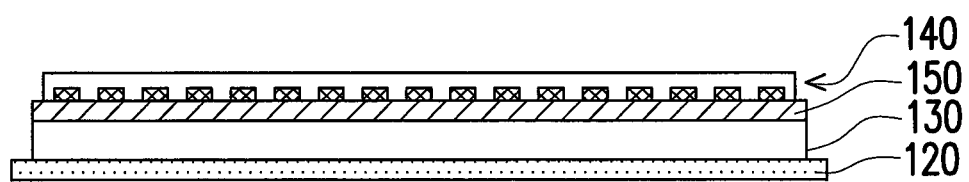

FIGS. 7A and 7B are schematic diagrams of a flexible display module according to another embodiment of the invention, where an assist-BUV layer 150 is formed on the flexible substrate 130 prior to the fabrication of the pixel array 140 to enhance the water-proof and oxygen-proof feature. After that, the pixel array 140 is fabricated on the assist-BUV layer 150 after the flexible substrate 130 is removed from the transparent carrier 110 via the photosensitive-release-film 120.

Figure 8:
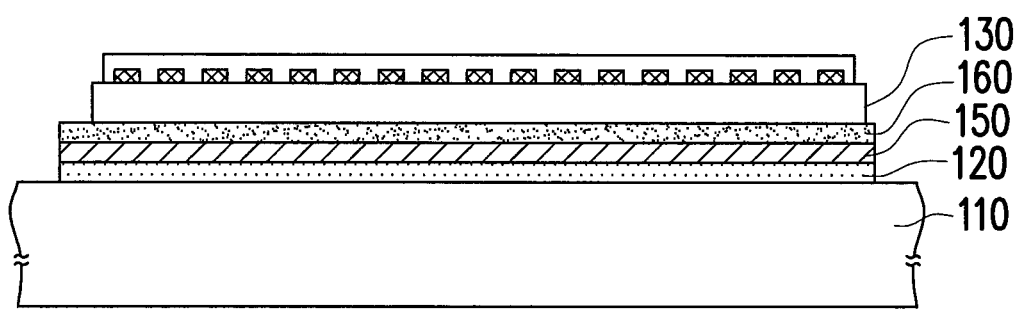

FIG. 8 is a schematic diagram of a flexible display module according to yet another embodiment of the invention, where a barrier layer 160 is disposed between the above-mentioned assist-BUV layer 150 and the flexible substrate 130 to enhance the water-proof and oxygen-proof feature. The barrier layer 160 can be inorganic material, for example, metal such as aluminium, metal oxide such as aluminium oxide or silicon nitride, silicon oxide or a combination of the above-mentioned materials.

The photosensitive-release-film 120 mentioned above in FIGS. 5-8 is oxidized as receiving the irradiate light and the bonding force thereof is weakened. Thus, oxygen is required in the light irradiation process. Specifically, oxygen enters the photosensitive-release-film 120 through the bonding interface as the assist-BUV layer 150 is located on or under the photosensitive-release-film 120. Otherwise, oxygen enters the flexible substrate 130 through the bonding interface first, and then being transmitted to the photosensitive-release-film 120, as the assist-BUV layer 150 is located on the flexible substrate 130.

In summary, the method for fabricating flexible display module of the invention can form a good and stable release interface between the flexible substrate and the transparent carrier through the photosensitive-release-film. After finishing the process, an irradiation step on the photosensitive-release-film is conducted to reduce the bonding force between the photosensitive-release-film and the transparent carrier and easily remove the flexible substrate together with the photosensitive-release-film from the transparent carrier. The fabrication of the photosensitive-release-film is easy without conducting patterning step, and the photosensitive-release-film has good temperature-durability so that the flexibility of the process and the selectable material range are advanced. On the other hand, the bonding force between the photosensitive-release-film and the transparent carrier can be controlled by adjusting the irradiation intensity or irradiation time in the method for fabricating flexible display module. In particular, UV light with a power lower than laser light can be adopted as the irradiation light source. Therefore, the cost is reduced.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A method for fabricating flexible display module, comprising:
    providing a transparent carrier having a carrying-surface and a back-surface opposite to the carrying-surface;
    forming a photosensitive-release-film on the carrying-surface, wherein the photosensitive-release-film is parylene;
    providing a flexible substrate on the photosensitive-release-film, and conducting heat treatment on the photosensitive-release-film prior to providing the flexible substrate so as to increase bonding force between the photosensitive-release-film and the transparent carrier;
    forming a pixel array on the flexible substrate;
    during or after forming the pixel array, conducting irradiation on the photosensitive-release-film from the back-surface of the transparent carrier to weaken bonding force between the photosensitive-release-film and the transparent carrier or simultaneously weaken both the bonding force between the photosensitive-release-film and the transparent carrier and structural strength of the photosensitive-release-film; and
    removing the flexible substrate from the transparent carrier, wherein at least one portion of the photosensitiverelease-film is peeled off from the carrying-surface and remains on the flexible substrate.

2. The method for fabricating flexible display module as claimed in claim 1, wherein the step of forming the pixel array comprises:
   forming a plurality of active devices on the flexible substrate; and
   forming a displaying component on the active devices.

3. The method for fabricating flexible display module as claimed in claim 2, wherein the step of conducting irradiation on the photosensitive-release-film is performed after forming the active devices and prior to forming the displaying component.

4. The method for fabricating flexible display module as claimed in claim 1, wherein the heat treatment comprises annealing.

5. The method for fabricating flexible display module as claimed in claim 1, wherein light used to irradiate the photosensitive-release-film is ultraviolet (UV) light.

6. The method for fabricating flexible display module as claimed in claim 1, wherein power of the light used to irradiate the photosensitive-release-film is greater than or equal to 5 $mW/cm^2$ but less than or equal to 300 $mW/cm^2$.

7. The method for fabricating flexible display module as claimed in claim 1, wherein the flexible substrate comprises a material of selected from the group consisting of polyimide (PI), polyethylene terephthalate (PET) and polyethylene naphthalate (PEN).

8. The method for fabricating flexible display module as claimed in claim 1, wherein after conducting irradiation on the photosensitive-release-film from the back-surface of the transparent carrier, a releasing force between the photosensitive-release-film and the transparent carrier is less than or equal to 25 gf.

9. The method for fabricating flexible display module as claimed in claim 1, wherein the photosensitive-release-film entirely overlaps bottom-surface of the flexible substrate.

10. The method for fabricating flexible display module as claimed in claim 1, wherein the photosensitive-release-film is entirely peeled off from the carrying-surface and remains on the flexible substrate.

11. The method for fabricating flexible display module as claimed in claim 1, further comprising forming an assist-BUV layer between the photosensitive-release-film and the transparent carrier, wherein the material of the assist-BUV layer comprises porous inorganic material, the assist-BUV layer is capable of enhancing an effect of irradiation on the photosensitive-release-film from the back-surface of the transparent carrier, so that the photosensitive-release-film evenly receives the irradiate light.

12. The method for fabricating flexible display module as claimed in claim 1, further comprising forming an assist-BUV layer between the photosensitive-release-film and the flexible substrate, wherein the material of the assist-BUV layer comprises porous inorganic material, the assist-BUV layer is capable of enhancing an effect of irradiation on the photosensitive-release-film from the back-surface of the transparent carrier; so that the photosensitive-release-film evenly receives the irradiate light.

13. The method for fabricating flexible display module as claimed in claim 12, further comprising forming a barrier layer between the assist-BUV layer and the flexible substrate.

14. The method for fabricating flexible display module as claimed in claim 1, further comprising forming an assist-BUV layer between the pixel array and the flexible substrate, wherein the material of the assist-BUV layer comprises porous inorganic material, the assist-BUY layer is capable of enhancing an effect of irradiation on the photosensitive-release-film from the back-surface of the transparent carrier, so that the photosensitive-release-film evenly receives the irradiate light.

* * * * *